United States Patent
Bhattad et al.

(10) Patent No.: US 10,771,049 B1
(45) Date of Patent: Sep. 8, 2020

(54) CONTROL CIRCUIT AND METHOD FOR AVOIDING REVERSE RECOVERY OF A POWER TRANSISTOR

(71) Applicant: Dialog Semiconductor (UK) Limited, London (GB)

(72) Inventors: Ambreesh Bhattad, Swindon (GB); Horst Knoedgen, Munich (DE)

(73) Assignee: Dialog Semiconductor (UK) Limited, London (GB)

( * ) Notice: Subject to any disclaimer, the term of this patent is extended or adjusted under 35 U.S.C. 154(b) by 0 days.

(21) Appl. No.: 16/456,233

(22) Filed: Jun. 28, 2019

(51) Int. Cl.
| | |
|---|---|
| *H03K 17/042* | (2006.01) |
| *H02M 1/08* | (2006.01) |
| *H03K 17/14* | (2006.01) |
| *H02M 1/00* | (2006.01) |

(52) U.S. Cl.
CPC ........ *H03K 17/04206* (2013.01); *H02M 1/08* (2013.01); *H03K 17/145* (2013.01); *H02M 2001/0054* (2013.01)

(58) Field of Classification Search
None
See application file for complete search history.

(56) References Cited

U.S. PATENT DOCUMENTS

| | | | |
|---|---|---|---|
| 5,180,964 A | 1/1993 | Ewing | |
| RE37,609 E | 3/2002 | Bittner | |
| 6,452,816 B2 | 9/2002 | Kuranuki et al. | |
| 6,545,882 B2 | 4/2003 | Yang | |
| 6,885,176 B2 | 4/2005 | Librizzi | |
| 7,098,641 B2 | 8/2006 | King | |
| 7,368,897 B2 | 5/2008 | Qahouq et al. | |
| 7,403,400 B2 | 7/2008 | Stanley | |
| 7,804,282 B2 | 9/2010 | Bertele | |
| 8,018,212 B1 | 9/2011 | Petricek | |
| 8,018,743 B2 | 9/2011 | Wang et al. | |
| 8,049,481 B2 | 11/2011 | Li et al. | |
| 9,929,653 B1 | 3/2018 | Mercer et al. | |

(Continued)

FOREIGN PATENT DOCUMENTS

| | | |
|---|---|---|
| CN | 106130344 | 11/2016 |
| DE | 2 323 482 | 11/1974 |

OTHER PUBLICATIONS

PCT International Search Report and Written Opinion, PCT Application No. PCT/US2009/064618, dated Jan. 13, 2010, 10 pages.

(Continued)

*Primary Examiner* — Cassandra F Cox
(74) *Attorney, Agent, or Firm* — Saile Ackerman LLC; Stephen B. Ackerman

(57) ABSTRACT

The present document describes a control circuit and a method for controlling a power transistor, wherein the power transistor has a drain, a gate and a source. The power transistor has a body diode. The control circuit is configured to predict a time instant at which a drain potential at the drain falls below a source potential at the source of the power transistor by more than a diode threshold voltage of the body diode. Furthermore, the control circuit is configured to apply a pre-bias potential and/or provide a pre-bias current to the gate of the power transistor in dependence the predicted time instant, such that a conducting channel between the drain and the source is provided, which at least partially takes over current which would otherwise flow through the body diode.

18 Claims, 5 Drawing Sheets

(56) References Cited

U.S. PATENT DOCUMENTS

| | | | |
|---|---|---|---|
| 9,997,946 | B2 | 6/2018 | Kogler et al. |
| 10,469,065 | B2 | 11/2019 | Knoedgen et al. |
| 2006/0273772 | A1 | 12/2006 | Groom |
| 2011/0267018 | A1 | 11/2011 | Tao |
| 2015/0002116 | A1 | 1/2015 | Bemon-Enjalbert et al. |
| 2016/0105110 | A1 | 4/2016 | Houston et al. |
| 2016/0294277 | A1 | 10/2016 | Romeo |
| 2017/0288528 | A1* | 10/2017 | McCoy .................. H02M 1/38 |
| 2018/0178833 | A1* | 6/2018 | Terdy .................. B62D 5/0484 |
| 2018/0287489 | A1 | 10/2018 | Ozanoglu et al. |

OTHER PUBLICATIONS

PCT International Search Report and Written Opinion, PCT Application No. PCT/US2010/023219, dated Apr. 12, 2010, 7 pages.

"Buck-Boost Converter Controlled by Hysteretic PWM Method with Input Voltage Feedforward," by Tomonori Watanabe et al., 2011 IEEE 33rd International Telecommunications Energy Conference (INTELEC), Oct. 9-13, 2011, 6 pages.

German Office Action, File No. 10 2017 212 349.4, Applicant: Dialog Semiconductor (UK) Limited, dated Mar. 13, 2018, 9 pages and English language translation, 7 pages.

Co-pending U.S. Appl. No. 16/050,746, filed Jul. 31, 2018, "Multi-level Power Converter with Light Load Flying Capacitor Voltage Regulation", by Aravind Mangudi et al., 35 pages.

"The forgotten converter," by Greg Lubarsky, Texas Instruments, Jul. 8, 2015, 10 pages, www.ti.com/lit/wp/slpy005/slpy005.pdf.

DA9318 High-Efficiency, 10 A, High-Voltage Direct Charger, 4 pages, Copyright Dialog Semiconductor 2017, www.dialog-semiconductor.com.

* cited by examiner

US 10,771,049 B1

CONTROL CIRCUIT AND METHOD FOR AVOIDING REVERSE RECOVERY OF A POWER TRANSISTOR

TECHNICAL FIELD

The present document relates to the control of a transistor, notably a MOS transistor. In particular, the present document relates to increasing the power efficiency of the control of a transistor

BACKGROUND

A switched power converter, notably a step-down converter, comprises one or more transistors, which are turned on and off in a repeated manner. In particular, a switched power converter may comprise a high side transistor and a low side transistor, which are turned on and off in an alternating manner. A dead time may be added between turn-off of the high side transistor and turn-on of the low side transistor (and vice versa), in order to avoid a shoot through current from the supply potential of the power converter to ground.

A transistor, notably a MOS (metal-oxide-semiconductor) transistor, typically comprises a body-diode which may be activated during the dead time, thereby leading to increased losses. These losses typically increase with increasing switching frequency of the transistor and/or with increasing cycle rate of a switched power converter.

The present document addresses the technical problem of reducing the (switching) losses of a transistor. This technical problem is solved by the independent claims. Preferred examples are described in the dependent claims.

SUMMARY

According to an aspect, a control circuit for controlling a power transistor is described. The power transistor exhibits a drain, a gate and a source. Furthermore, the power transistor exhibits a body diode, which may be arranged between the source and the drain. In particular, the body terminal of the (MOS) power transistor is typically tied to its source, and the body diode is typically present between the body terminal and the drain. As the source is tied to body the body diode looks as between arranged between the source and the drain. Alternatively, the body diode may be attached or coupled to a different point or to a different potential than the source.

The control circuit is configured to predict a time instant at which a drain potential at the drain falls below a source potential at the source of the power transistor by more than a diode threshold voltage (i.e. the forward voltage) of the body diode. Furthermore, the control circuit is configured to apply a pre-bias potential to the gate of the power transistor in dependence of (notably at) the predicted time instant, such that a conducting channel between the drain and the source is provided, which at least partially takes over current which would otherwise flow through the body diode.

According to another aspect, a method for controlling a power transistor is described. The power transistor exhibits a drain, a gate and a source, and a body diode between the source and the drain. The method comprises predicting a time instant or time interval, at or during which a drain potential at the drain falls below a source potential at the source of the power transistor by more than a diode threshold voltage (i.e. the forward voltage) of the body diode. Furthermore, the method comprises applying a pre-bias potential to the gate of the power transistor in dependence of (notably at) the predicted time instant or time interval, such that a conducting channel between the drain and the source is provided, wherein the channel at least partially takes over current (from the source to the drain) which would otherwise flow through the body diode.

It should be noted that the methods and systems including its preferred embodiments as outlined in the present document may be used stand-alone or in combination with the other methods and systems disclosed in this document. In addition, the features outlined in the context of a system are also applicable to a corresponding method. Furthermore, all aspects of the methods and systems outlined in the present document may be arbitrarily combined. In particular, the features of the claims may be combined with one another in an arbitrary manner.

In the present document, the term "couple" or "coupled" refers to elements being in electrical communication with each other, whether directly connected e.g., via wires, or in some other manner.

BRIEF DESCRIPTION OF THE DRAWINGS

The invention is explained below in an exemplary manner with reference to the accompanying drawings, wherein.

DESCRIPTION

Figure 1A:
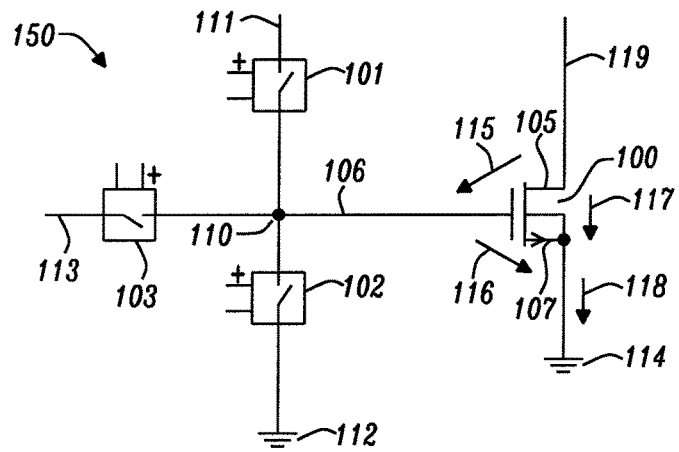
FIG. 1A shows an example control circuit for controlling a transistor.

As outlined above, the present document addresses the technical problem of reducing the switching losses of a transistor during turn-on or turn-off of the transistor. In this context, FIG. 1A shows an example transistor 100, notably a MOS transistor and/or a LD (laterally diffused) MOS transistor. The transistor 100 exhibits a drain 105, a source 107 and a gate 106. The drain-source current 118 between the drain 105 and the source 107 of the transistor 100 is typically dependent on the gate-source voltage 116. Typically, the transistor 100 exhibits a threshold voltage $V_t$ (e.g. $V_t$=500 mV). The transistor 100 may start to conduct, when the gate-source voltage 116 $V_{gs}$ exceeds the threshold voltage $V_t$. The transistor 100 may be fully turned on, when the gate-source voltage 116 reaches a pre-determined overdrive voltage (which is higher than the threshold voltage).

In the illustrated example, the drain 105 of the transistor 100 is coupled to a drain voltage or drain potential 119, and the source 107 of the transistor 100 is coupled to a source voltage or source potential 114 (which may correspond to ground in case of a low side transistor). The gate 106 of the transistor 100 may exhibit a gate voltage or gate potential 110 (which may be set using the control circuit 150). Hence, the transistor 100 exhibits a drain-gate voltage 115 between the drain 105 and the gate 106, a gain-source voltage 116 between the gate 106 and the source 107, as well as a drain-source voltage 117 between the drain 105 and the source 107.

FIG. 1A shows a control circuit 150 for controlling the transistor 100. The control circuit 150 comprises a first control switch 101 which is configured to couple the gate 106 of the transistor 100 with a first potential 111 that fully turns on the transistor 100 (wherein the first potential 111 may be at or above the overdrive voltage of the transistor 100). In particular, by closing the first control switch 101, the gate voltage 110 may be set to the first potential 111 (to (fully) turn on or close the transistor 100). Furthermore, the control circuit 150 comprises a second control switch 102 which is configured to couple the gate 106 of the transistor 100 with a second potential 112 (e.g. ground). In particular, by closing the second control switch 102, the gate voltage 110 at the gate 106 of the transistor 100 may be set to the second potential 112 (to (fully) turn off or open the transistor 100).

The on-resistance $R_{ds}$ of a transistor 100 typically depends on the level of the gate-source voltage $V_{gs}$ 116, and/or on the type of transistor 100. In particular, different types of transistor 100 may exhibit different overdrive voltages, wherein the overdrive voltage indicates the gate-source voltage 116 at which the on-resistance is minimal. In other words, the overdrive voltage indicates the gate-source voltage 116 at which the transistor 100 is fully turned on.

The ratio of the overdrive voltage with respect to the threshold voltage may be different (notably lower) for a low voltage gate transistor compared to conventional transistor. By way of example, a first transistor 100 may exhibit a low voltage gate with an overdrive voltage of 1.5V and a second transistor 100 may exhibit a gate with an overdrive voltage of 5V. Both transistors may have the same threshold voltage (e.g. 0.5V) and the same maximum drain-source voltage rating. The 5V gate transistor 100 may require 5V Vgs for a minimum on-resistance, and the 1.5V transistor may require a Vgs of 1.5V for a minimum on-resistance. Hence, the ratio of the maximum Vgs (overdrive voltage) to the threshold voltage is 10 for the 5V gate transistor and 3 for the 1.5V gate transistor.

Figure 1B:
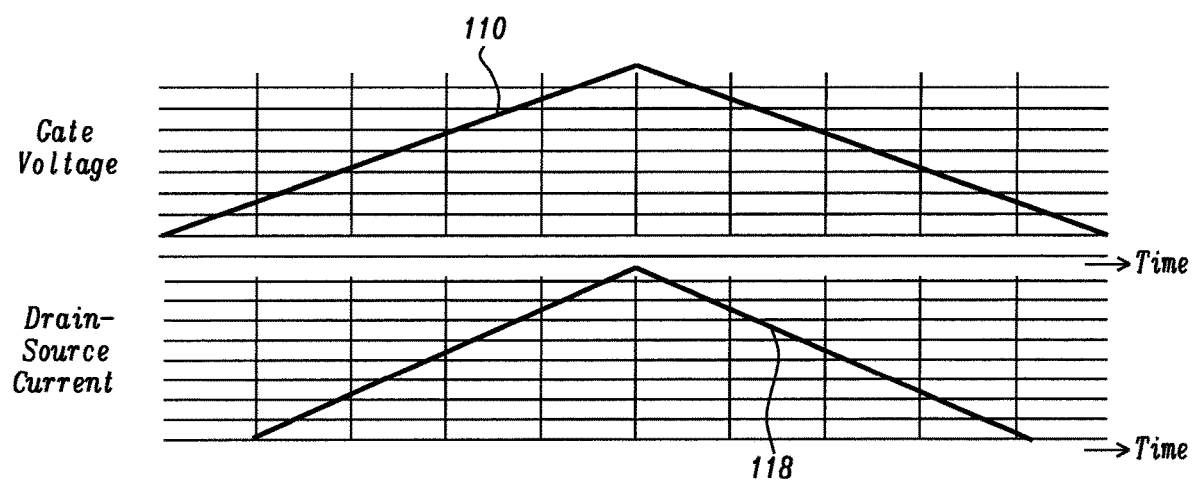
FIG. 1B shows an example gate voltage at the gate of a transistor and a corresponding drain-source current through the transistor.

FIG. 1B illustrates the gate voltage 110, and the corresponding drain-source current 118. It can be seen that a drain-source current 118 starts to flow, as soon as the gate voltage 110 exceeds the threshold voltage. Furthermore, the drain-source current 118 continues to increase with increasing gate voltage 110 (until the overdrive voltage is reached).

The transistor 100 may be a symmetrical device and the on-resistance $R_{ds}$ may be the same regardless the current polarity of the drain-source current 118. Hence, a (negative) drain-gate voltage 115 which exceeds the threshold voltage $V_t$ of the transistor 100 may lead to a (negative) drain-source current 118 through the channel of the transistor 100 (from the source 107 to the drain 105), wherein the on-resistance of the channel decreases with increasing magnitude of the (negative) drain-gate voltage 115.

Figure 2:
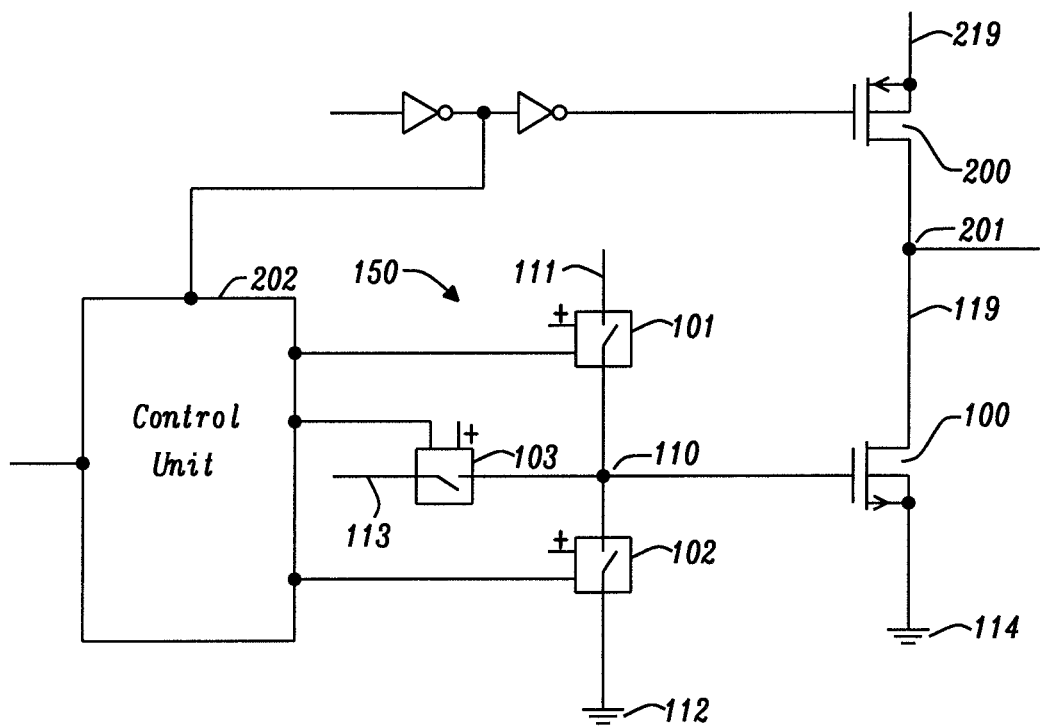
FIG. 2 shows an example half bridge, as used e.g. within a switching converter.

FIG. 2 shows an example half bridge which may be part of a switched power converter. The half bridge comprises a high side transistor 200 and a low side transistor 100, which are coupled with one another via a mid node 201 (also referred to as the LX node). The mid node 201 may be coupled to an output of the power converter, via an inductor. FIG. 2 also shows a control unit 202 which is configured to control the transistors 200, 100 in an alternating manner, such that the high side transistor 200 is turned on, when the low side transistor 100 is turned off, and such that the high side transistor 200 is turned off, when the low side transistor 100 is turned on.

The high side transistor 200 is coupled to a supply voltage or supply potential 219. If the high side transistor 200 is turned on (and the low side transistor 100 is turned off), the drain 105 of the low side transistor 100 is coupled to the supply potential 219, i.e. the drain potential 119 corresponds to the supply potential 219 (apart from the voltage drop at the high side transistor 200). On the other hand, if the high side transistor 200 is turned off (and the low side transistor 100 is turned on), the drain 105 of the low side transistor 100 is coupled to the source potential 214 (e.g. ground), i.e. the drain potential 119 corresponds to the source potential 214 (apart from the voltage drop at the low side transistor 100).

Between the time instant at which the high side transistor 200 is turned off and the time instant at which the low side transistor 100 is turned on, there is typically a dead time interval, during which the high side transistor 200 and the low side transistor 100 are turned off. As a result of this, the drain potential 119 typically depends on the circuitry which is coupled to the mid node 201. Notably in case the mid node 201 is coupled to an inductor the drain potential 119 may be forced to fall below the source potential 114. As a result of this, the drain-source voltage 117 may become negative.

A similar situation may occur during the dead time interval between the time instant at which the low side transistor 100 is turned off and the time instant at which the high side transistor 200 is turned on.

The (low side) transistor 100 typically exhibits a body diode between the source 107 and the drain 105 of the transistor 100. The body diode may exhibit a (forward) diode threshold voltage (e.g. of 700 mV). Hence, if the drain potential 119 falls below the source potential 114 by more then the diode threshold voltage, the body diode of the transistor 100 starts to conduct, thereby leading to a reverse drain-source current 118.

Figure 1C:
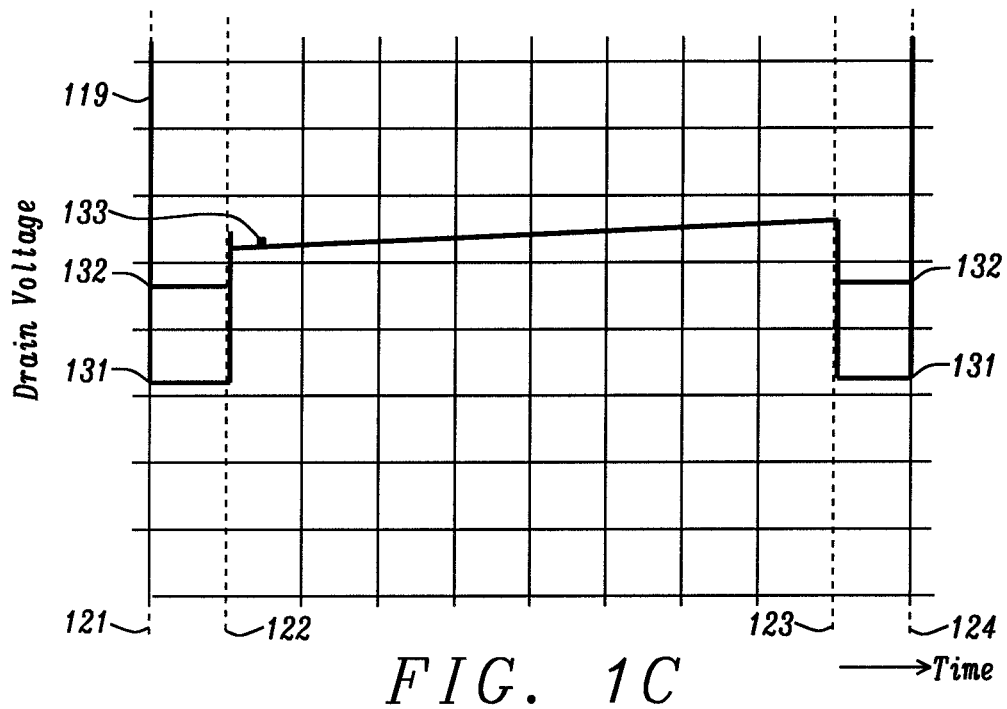
FIG. 1C illustrates the drain voltage as a function of time, when turning on or off a transistor.

FIG. 1C illustrates the drain potential 119 at the mid node 201 as a function of time. At a first time instant 121 the high side transistor 200 is turned off, such that the drain potential 119 drops from the supply potential 219 to a dead time potential 131. Subsequent to the dead time interval, at the second time instant 122, the low side transistor 100 is turned on, such that the drain voltage 119 is increased to an on-potential 133 (which is typically dependent on the source potential 114, the drain-source current 118 and the on-resistance of the transistor 100).

At a third time instant 123, the low side transistor 100 is turned off, such that the drain potential 119 drops to the dead time potential 131. Subsequent to the dead time interval, at the fourth time instant 124, the high side transistor 200 is turned on, thereby increasing the drain potential 119 to the supply potential 219.

As indicated above, the dead time potential 131 may be low enough to cause conduction of the body diode of the transistor 100. During the dead time interval, both the first control switch 101 and the second control switch 102 may be open, such that the gate 106 of the transistor 100 is floating. The control circuit 150 may comprise a pre-bias control switch 103 which is configured to couple the gate 106 of the transistor 100 with a pre-bias or intermediate potential 113 during the dead time interval of the transistor 100. The intermediate potential 113 may have a value between 0V and the threshold voltage $V_t$ of the transistor 100. In particular, the intermediate potential 113 may be slightly lower than the threshold voltage $V_t$ (e.g. by 100 mV or less). As a result of this, the (negative) drain-gate voltage 115 may exceed the threshold voltage $V_t$ of the transistor 100 to ensure that the channel of the transistor 100 conducts (instead of the body diode). In view of the fact that the channel of the transistor 100 typically exhibits a lower voltage drop compared to the body diode, the losses of the transistor 100 can be reduced.

As a result of applying the intermediate or pre-bias voltage 113 to the gate 106 during the dead time interval, and as a result of the channel of the transistor 100 going into a conducting state, the drain potential 119 is increased to a potential 132 (as shown in FIG. 1C). The potential 132 may be sufficiently close to the source potential 114, in order to prevent the body diode of the transistor 100 from conducting. In other words, the magnitude of the difference between the potential 132 and the source potential 114 may be lower than the forward voltage of the body diode of the transistor 100.

Hence, the gate 106 of the transistor 100 may be pre-biased with the intermediate potential 113, at time instants which depend on the switching times of the transistor 100 and/or of the power converter that comprises the transistor 100. By doing this, it may be ensured that during the dead time intervals the channel of the transistor 100 conducts a negative drain-source current 118 (instead of the body diode of the transistor 100).

As shown in FIG. 1A, using a 3-level gate control, the reverse mode of a transistor 100 (i.e. a reverse drain/source conduction) may be adjusted. At a drain voltage 119 of e.g. –600 mV (with the gate 106 being pre-set to e.g. 500 mV) the transistor 100 typically exhibits a relatively low on-resistance $R_{ds}$ (compared to the resistance of the body diode). By performing a pre-bias of the gate 106, conduction of the body diode may be avoided.

Pre-setting of the gate 106 of a transistor 100 typically requires a certain time delay. The signal for starting the pre-setting of the gate 106 may be advanced with respect to the first time instant 121 (for turning on the transistor 100) and/or possibly with respect to the third time instant 123 (for turning off the transistor 100) by the known time delay. By doing this, a reliable pre-biasing of the gate 106 of a transistor 100 may be implemented.

Figure 3:
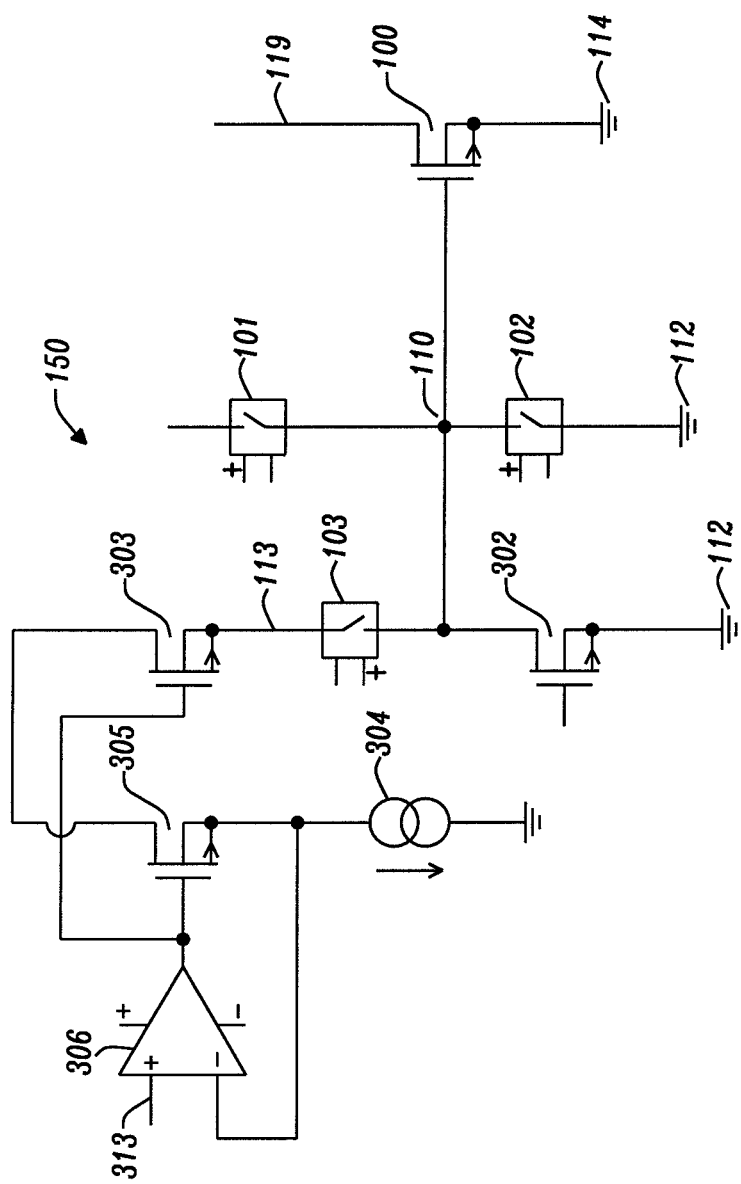
FIG. 3 shows example circuitry for generating a pre-bias or intermediate voltage.

FIG. 3 illustrates example circuitry for generating the intermediate or pre-bias potential 113. A target value 313 for the intermediate potential 113 may be set at the input of an operational amplifier 306 which controls the transistors 303, 305. The second transistor 303 may be scaled copy of the first transistor 305. The operational amplifier 306 may be configured to set the potential at the sources of the transistors 303, 305, in accordance to the target value 313 for the intermediate potential 113. The regulation of the intermediate potential 113 is performed by feeding back the potential of the source of the first transistor 305 back to an input of the operation amplifier 306, wherein the source of the first transistor 305 is coupled to a current source 304.

Hence, FIG. 3 shows circuitry for generating the intermediate voltage 113. The source follower shown in FIG. 3 is typically relatively fast. Furthermore, the second transistor 303, which provides the intermediate voltage 113, is outside of the regulation loop of the amplifier 306, such that the voltage setting only depends on the the gm of the second transistor 303 (which may be a MOS transistor or a NPN transistor). When turning on the first control switch 101 (in order to turn on the power transistor 100), the second transistor 303 may still be active, and the second transistor 303 may be turned off automatically, because the source of the second transistor 303 will be at a higher potential than the gate of the second transistor 303. On the other hand, using a pull down, the intermediate voltage for the second transistor 303 may be established relatively fast (due to a capacitive discharge).

The schemes described in the present document allow avoiding or at least reducing reverse recovery losses of a power transistor 100. In particular, body diode conduction and current injection into the substrate of a power transistor 100 may be avoided. During a negative current condition through a power transistor 100, the power transistor 100 may act as a source follower before the body diode clamps the source. The schemes may be used in various different types of switched power converters.

The intermediate voltage 113 which is applied to the gate 106 of a power transistor 100 may be dependent on the temperature of the power transistor 100. Alternatively, or in addition, the intermediate voltage 113 may depend on the load voltage and/or load current of a power converter which comprises the power transistor 100.

In particular, the schemes outlined in the present document may be applied to the low side transistor 100 of a step-down converter or to the high side transistor of a step-up converter.

Alternatively, or in addition, the intermediate voltage 113 may be set in dependence of a condition of a circuit (notably a power converter) that the power transistor 100 is used in.

Figure 5:
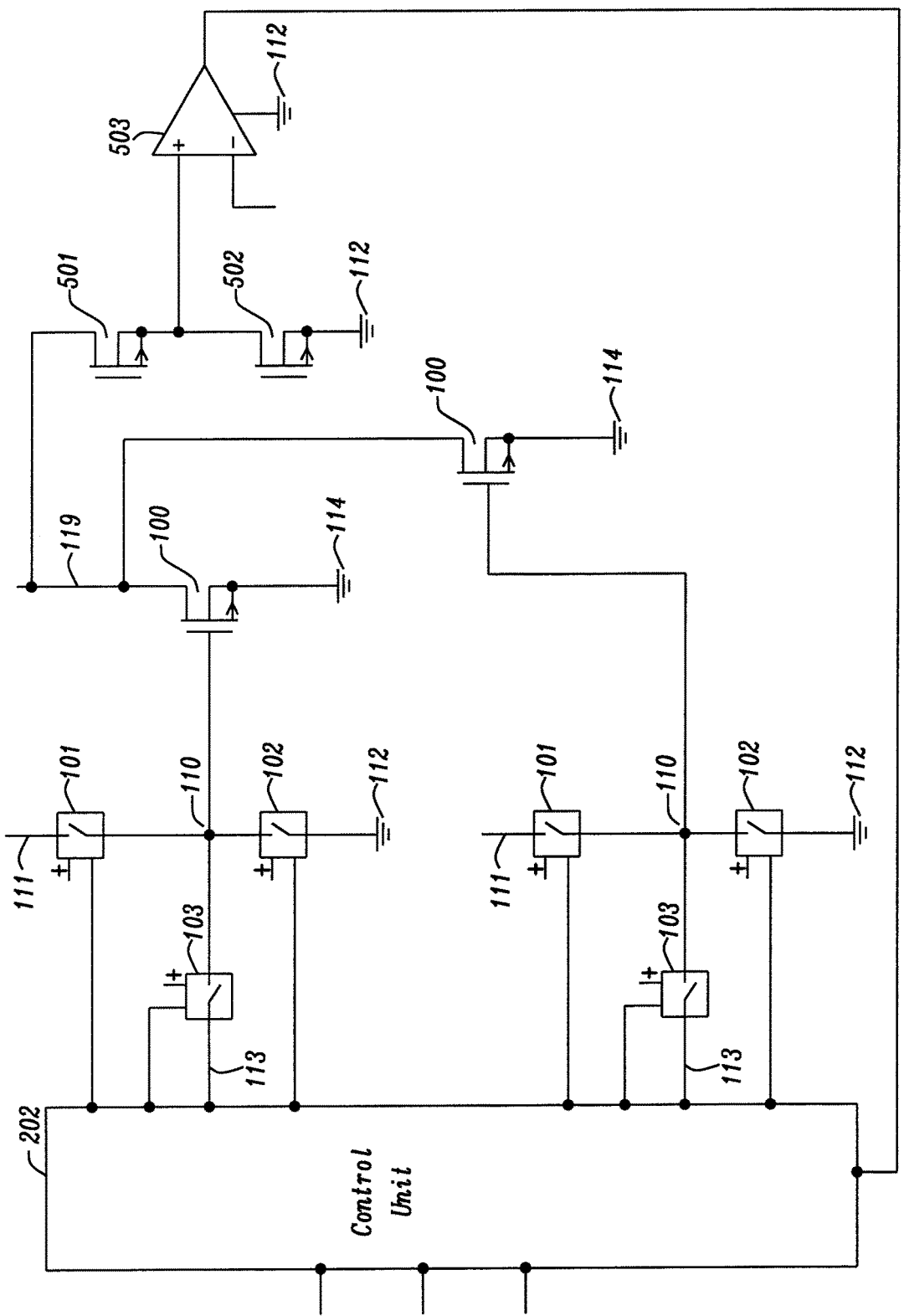
FIG. 5 shows an example control circuit for setting the intermediate voltage of a transistor.

FIG. 5 shows an excerpt of a circuit comprising one or more power transistors 100, which may be activated in dependence of the load of the circuit. Hence, the power transistor 100 shown in FIG. 5 may represent different slices or parts of an overall pass device.

Furthermore, FIG. 5 comprises circuitry 501, 502, 503 for sensing the mid node 201, notably for sensing the drain voltage 119 at the mid node 201. The output of the sensing circuitry 501, 502, 503 may be fed to the control unit 202, wherein the control unit 202 is configured to set the level of the intermediate potential 113, in dependence of the condition (notably the drain voltage 119) of the mid node 201. Furthermore, the control unit 202 may be configured to activate or to deactivate one or more of the transistors 100.

The (negative) drain voltage 119 at node 201 (when the body diode of the transistor 100 conducts) is typically a logarithmic function of the drain-source current 118. Hence, by decompressing the sensed drain voltage 119 using an anti-log function, the sensed drain voltage 119 may be converted to provide an indication of the drain-source current 118. Hence, it may be determined based on the sensed drain voltage 119, how much conduction occurs (i.e. how much current flows) through the body diode of the transistor 100. The intermediate potential 113 may be adjusted in a subsequent cycle (for turning on or off the transistor 100), in order to reduce or inhibit body diode conduction. Such an adjustment of the level of the intermediate potential 113 may e.g. occur subject to a change of the load of a power converter which comprises the transistor 100.

Alternatively, or in addition, a negative gate supply (gate/source) may be used to minimize the leakage current in the drain 105 of the transistor 100 and to increase the noise immunity for turning off the transistor 100. This may be achieved using a negative charge pump.

Hence, the gate 106 of a transistor 100 may be set to the first potential 111, to the second potential 112, to the variable intermediate potential 113 and/or to a negative potential.

The pre-bias voltage or the intermediate voltage 113 in multi-level gate control may be modulated as a function of the operating current and/or operating condition of a circuit which comprises the transistor 100. By doing this, the leakage in the power transistor 100 may be optimized. In particular, the extent of reverse mode operation of a power transistor 100 may be actively controlled. For this purpose, the reverse mode voltage (i.e. the drain potential 119) may be sensed. Furthermore, the size of a transistor 100, 200 (e.g. the number of active slices of a transistor 100, 200) may be controlled in dependence of the sensed drain potential 119. By adjusting the size of a power transistor 100, 200, the gate-charge for turning on the power transistor 100, 200 may be reduced, thereby reducing the power consumption.

Hence, the gate pre-bias voltage 113 may be modulated as a function of the system operating conditions. In particular, at a relatively high load the leakage current through a power transistor 100 may not be relevant in comparison to relatively low loads. Hence, the level of the intermediate potential 113 may be decreased with increasing load current. The intermediate voltage 113 may be set in dependence of the level of the drain voltage 119 at the drain 105 of the power transistor 100.

Figure 4:
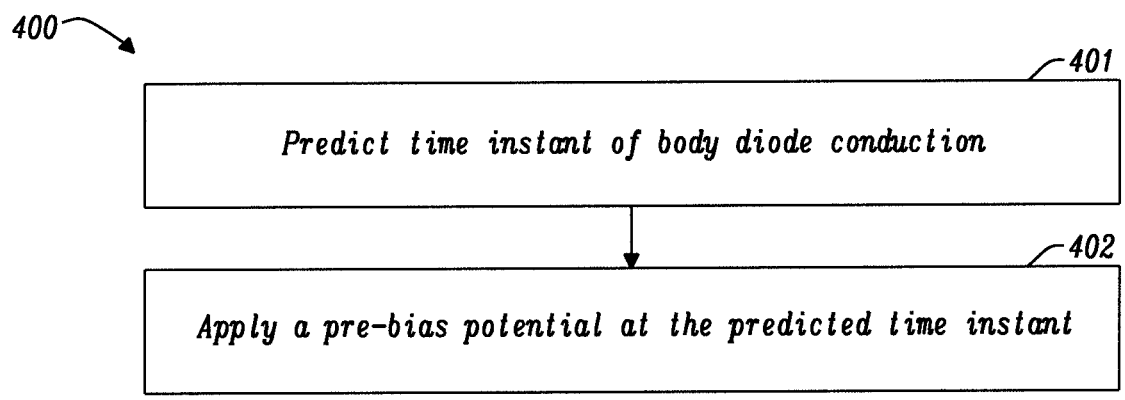
FIG. 4 shows a flow chart of an example method for controlling a transistor.

FIG. 4 shows a flow chart of an example method 400 for controlling a power transistor 100, notably a MOS transistor. The power transistor 100 exhibits a drain 105, a gate 106 and a source 107. Furthermore, the power transistor 100 exhibits a body diode between the source 107 and the drain 105, wherein the body diode is forward biased in a direction going from the source 107 to the drain 105.

The method 400 comprises predicting 401 a time instant 121, 123 or a time interval, at or during which the drain potential 119 at the drain 105 falls below the source potential 114 at the source 107 of the power transistor 100 by more than a diode threshold voltage of the body diode. In other words, a time instant 121, 123 or a time interval may be predicted, at or during which body diode conduction will occur. Such a situation may notably occur when using a power transistor 100, e.g. a LDMOS transistor, with gates 106 that a controlled with relative low gate voltages (e.g. with overdrive voltages in the range of 1.5V or less).

Furthermore, the method 400 comprises applying 402 a pre-bias potential 113 to the gate 106 of the power transistor 100 in dependence of (notably at) the predicted time instant 121, 123 or during the predicted time interval, such that a conducting channel between the drain 105 and the source 107 is provided, which at least partially takes over current which would otherwise flow through the body diode. The conducting channel typically has a lower on-resistance compared to the resistance of the body diode, thereby reducing the power consumption of the power transistor 100.

Hence, a control circuit 150, 202 for controlling a power transistor 100, notably a MOS or LDMOS transistor, is described. The power transistor 100 may exhibit a drain 105, a gate 106 and/or a source 107. Furthermore, the power transistor 100 may exhibit a body diode between the source 107 and the drain 105.

The control circuit 150, 202 is configured to predict a time instant 121, 123 at which or a time interval during which the drain potential 119 at the drain 105 falls below the source potential 114 at the source 107 of the power transistor 100 by more than the diode threshold voltage of the body diode. As a result of this, body diode conduction may occur.

The predicted time instant 121, 123 and/or the predicted time interval may be determined based on the switching time instants for the power transistor 100 and/or for another transistor 200 operating in conjunction with the power transistor 100 (e.g. within a power converter which may comprise an inductor). In particular, the power transistor 100 may be repeatedly turned on and off at turn-on time instants 122 and at turn-off time instants 124, respectively. The predicted time instant 121, 123 and/or the predicted time interval may directly precede a turn-on time instant 122 or a turn-off time instant 124.

The power transistor 100 may be part of a half bridge comprising a second power transistor 200 (e.g. a half bridge within a switched power converter). The control circuit 150, 202 may be configured to turn on the power transistor 100 and the second power transistor 200 repeatedly and alternately in a mutually exclusive manner, such that a time instant at which one of the power transistors 100, 200 of the half bridge is turned off and a subsequent time instant at which the other one of the power transistors 100, 200 of the half bridge is turned on are separated by a dead time interval. The predicted time instant 121, 123 and/or the predicted time interval may fall within a dead time interval and/or may correspond to a dead time interval.

In particular, the power transistor 100 may be the low side transistor of a half bridge which also comprises a high side transistor 200. The half bridge may be arranged between a supply potential 219 and a reference potential 114 (e.g. ground). The predicted time instant 121 and/or the predicted time interval may lie between a time instant at which the high side transistor 200 is turned off and a subsequent time instant at which the power transistor 100 is turned on. Alternatively, the predicted time instant 123 or the predicted time interval may lie between a time instant at which the power transistor 100 is turned off and a subsequent time instant at which the high side transistor 200 is turned on.

Hence, the time instant 121, 123 or time interval for body diode conduction may be predicted in an efficient and precise manner.

Furthermore, the control circuit 150, 202 may be configured to apply a pre-bias potential 113 and/or to provide a pre-bias current to the gate 106 of the power transistor 100 in dependence of (notably at) the predicted time instant 121, 123 and/or during the (complete) predicted time interval, such that a conducting channel between the drain 105 and the source 107 is provided, which at least partially takes over current which would otherwise flow through the body diode. The channel may allow a current to flow from the source 107 to the drain 105. The conducting channel typically exhibits a lower on-resistance than the body diode, thereby increasing the power efficiency of the power transistor 100.

The power transistor 100 typically exhibits a threshold voltage corresponding to a minimum gate-source voltage 116 which is to be applied to the gate 106 of the power transistor 100 for turning on the power transistor 100. The control circuit 150, 202 may be configured to set the pre-bias potential 113 at a level which lies below the threshold voltage. Alternatively, or in addition, the control circuit 150, 202 may be configured to charge the gate capacitance of the gate 106 of the power transistor 100 such that the gate 106 exhibits a potential at a level which lies below the threshold voltage. By doing this, a shoot-through between the supply potential 219 and the reference potential 114 may be avoided in a reliable manner. By way of example, the level of the pre-bias voltage 113 may be in the range between 10% and 100% of the threshold voltage of the power transistor 100.

The control circuit 150, 202 may be configured to set the pre-bias potential 113 and/or provide the pre-bias current such that conduction through the body diode is (completely) prevented at the predicted time instant 121, 123 and/or during the (entire) predicted time interval. As a result of this, a particularly power efficient operation of the power transistor 100 is enabled.

The control circuit 150, 202 may comprise a first control switch 101 configured to (directly) couple the gate 106 of the power transistor 100 with a first potential 111 for (fully) turning on the power transistor 100. Furthermore, the control circuit 150, 202 may comprise a second control switch 102 configured to (directly) couple the gate 106 of the power transistor 100 with a second potential 112 for (fully) turning off the power transistor 100. In addition, the control circuit 150, 202 may comprise a third control switch 103 configured to (directly) couple the gate 106 of the power transistor 100 with the pre-bias potential 113 (in order to reduce or avoid body diode conduction). The pre-bias potential 113 typically is an intermediate potential between the first potential 111 and the second potential 112. Hence, a three-level control of the power transistor 100 may be provided in an efficient manner.

The control circuit 150, 202 may comprise pre-bias circuitry configured to charge the (internal) gate capacitor at the gate 106 of the power transistor 100 to the pre-bias potential 113 (using the pre-bias current). The pre-bias circuitry may comprise an operational amplifier 306 having an output controlling a first transistor 305 and a second transistor 303. The source of the first transistor 305 may be fed back to an input of the operational amplifier 306. Another input of the operational amplifier 306 may be coupled to a target level 313 for the pre-bias potential 113. A current source 304 may be used to drive current through the first transistor 305 and/or through the second transistor 303. As such, the source of the first transistor 305 may be regulated to the target level 313 for the pre-bias potential 113. On the other hand, the source of the second transistor 303 may be used to charge the gate capacitor at the gate 106 of the power transistor 100 to the pre-bias potential 113 (using the current provided by the current source 304). As a result of this, the gate capacitor may be charged in a rapid manner, thereby enabling a rapid pre-biasing of the gate 106 of the power transistor 100.

The power transistor 100 may be operated within a host circuit, notably within a power converter. The control circuit 150, 202 may be configured to determine an operational condition of the host circuit; and to adapt a level of the pre-bias potential 113 and/or of the pre-bias current in dependence of the operational condition. By doing this, the power efficiency of the host circuit may be increased.

The control circuit 150, 202 may be configured to determine temperature information regarding the temperature of the power transistor 100. Typically, the threshold voltage of the power transistor 100 decreases with increasing temperature (and vice versa). The control circuit 150, 202 may be configured to adapt the level of the pre-bias potential 113 and/or of the pre-bias current in dependence of the temperature information. In particular, the control circuit 150, 202 may be configured to increase the level of the pre-bias potential 113 and/or of the pre-bias current, if the temperature information indicates that the temperature of the power transistor 100 has dropped, and/or to decrease the level of the pre-bias potential 113 and/or of the pre-bias current, if the temperature information indicates that the temperature of the power transistor 100 has increased. By setting the pre-bias potential 113 and/or of the pre-bias current in dependence of the temperature, the power efficiency can be increased further.

The control circuit 150, 202 may be configured to determine a voltage indication indicating a level of the drain potential 119 at the drain 105 of the power transistor 100. Typically, the need for pre-biasing increases, as the drain potential 119 falls further below the source potential 114. The control circuit 150, 202 may be configured to adapt a level of the pre-bias potential 113 and/or of the pre-bias current in dependence of the voltage indication. In particular, the control circuit 150, 202 may be configured to increase the level of the pre-bias potential 113 and/or of the pre-bias current, if the voltage indication indicates that the drain potential 119 has dropped further below the source potential 114. and/or to decrease the level of the pre-bias potential 113 and/or of the pre-bias current, if the voltage indication indicates that the drain potential 119 has moved closer to the source potential 114. As a result of this, the power efficiency can be increased further.

The control circuit 150, 202 may be configured to determine a load indication indicating a level of the drain-source current 118 flowing through the power transistor 100, when the power transistor 100 is (fully) turned on. Furthermore, the control circuit 150, 202 may be configured to adapt a level of the pre-bias potential 113 and/or of the pre-bias current in dependence of the load indication. In particular, the control circuit 150, 202 may be configured to increase the level of the pre-bias potential 113 and/or of the pre-bias current, if the load indication indicates that the level of the drain-source current 118 has increased, and/or to decrease the level of the pre-bias potential 113 and/or of the pre-bias current, if the load indication indicates that the level of the drain-source current 118 has decreased. As a result of this, the power efficiency can be increased further.

Hence, the control circuit 150, 202 may be configured to apply a pre-bias potential 113 to the gate 106 of the power transistor 100 during the dead time interval, thereby providing a relatively fast charging of the gate capacitance to the pre-bias potential 113. Alternatively, or in addition, the control circuit 150, 202 may be configured to charge the gate 106 of the power transistor 100 using the pre-bias current, such that at (or stating at) the predicted time instant 121, 123 the gate 106 exhibits the pre-bias potential 113. The charging of the gate capacitance using a pre-bias current may start prior to the dead time interval, thereby providing an increased time interval for charging the gate capacitance of the power transistor 100.

By way of example, charging of the gate 106 of the (low side) power transistor 100 may start (e.g. using a fixed or variable pre-bias current) during the ON time of the (high side) power transistor 200. The gate capacitance of the (low side) power transistor 100 is typically known and with information about the ON time of (high side) transistor 200 and about the level of the pre-bias potential 103 to be applied, the pre-bias current for charging the gate capacitance of the (low side) power transistor 100 may be controlled. In particular, the pre-bias current may be controlled (in dependence of the gate capacitance, in dependence of the duration of the ON time of the (high side) transistor 200 and/or in dependence of the level of the pre-bias potential 103), such that at the predicted time instant 121, 123 the gate 106 exhibits the pre-bias potential 113. As a result of this, the need for fast charging of the gate 106 of the power transistor 100 may be avoided.

Hence, the control circuit 150, 202 may be configured to determine a level of the pre-bias current in dependence of a gate capacitance of the gate 106 of the power transistor 100 and in dependence of a level of the pre-bias potential 103. Furthermore, the control circuit 150, 202 may be configured to provide the determined level of the pre-bias current to the gate 106 of the power transistor 100 prior to the predicted time instant 121, 123, such that at the predicted time instant 121, 123 the gate 106 exhibits the pre-bias potential 103. The pre-bias current may be provided to the power transistor 100 prior to the beginning of a dead time interval (for turning on the power transistor 100).

As indicated above, the power transistor 100 may be operated within a host circuit, notably a power converter. The host circuit may comprise a plurality of power transistors 100 (e.g. 2 or more, 3 or more, 4 or more, 5 or more, etc.) which are operated in a corresponding plurality of parallel slices (as illustrated in FIG. 5). In particular, the host circuit may comprise a plurality of parallel half bridges. The plurality of power transistors 100 may correspond to the plurality of low side transistors of the corresponding plurality of half bridges.

The control circuit 150, 202 may be configured to determine a load indication indicating a level of a drain-source current flowing through the plurality of power transistors 100, when the plurality of power transistors 100 is turned on. Furthermore, the control circuit 150, 202 may be configured to adapt the number of power transistors 100 from the plurality of power transistors 100, to which the pre-bias potential 103 is applied and/or to which the pre-bias current is provided in dependence of the load indication. In particular, the number of power transistors 100 may be reduced, if the load indication indicates a relatively low load current. On the other hand, the number of power transistors 100 may be increased, if the load indication indicates a relatively high load current. By doing this, the power consumption of the host circuit may be reduced.

Using the schemes outlined in the present document, the use of a high voltage transistor 100 (e.g. with an overdrive voltage of 10V) may be avoided. Instead a low voltage transistor 100 (e.g. with an overdrive voltage of 1.5V) may be used, in conjunction with the three-level control described herein.

The schemes described herein may be used in different kinds of switch mode converters. Furthermore, the schemes are beneficial for a negative voltage converter because no substrate current occurs. The schemes can also be used for latch-up protection. Any circuit in which the body diode of a transistor may be activated, may make use of the schemes described herein, in order to ensure that the body diode remains deactivated.

It should be noted that the description and drawings merely illustrate the principles of the proposed methods and systems. Those skilled in the art will be able to implement various arrangements that, although not explicitly described or shown herein, embody the principles of the invention and are included within its spirit and scope. Furthermore, all examples and embodiment outlined in the present document are principally intended expressly to be only for explanatory purposes to help the reader in understanding the principles of the proposed methods and systems. Furthermore, all statements herein providing principles, aspects, and embodiments of the invention, as well as specific examples thereof, are intended to encompass equivalents thereof.

What is claimed is:

1. A control circuit for controlling a power transistor; wherein the power transistor exhibits a drain, a gate and a source, and wherein the power transistor exhibits a body diode; wherein the control circuit is configured to
   predict a time instant at which a drain potential at the drain falls below a source potential at the source of the power transistor by more than a diode threshold voltage of the body diode; and
   apply a pre-bias potential and/or provide a pre-bias current to the gate of the power transistor in dependence of the predicted time instant, such that a conducting channel between the drain and the source is provided, which at least partially takes over current which would otherwise flow through the body diode.

2. The control circuit of claim 1, wherein
   the power transistor is repeatedly turned on and off at turn-on time instants and at turn-off time instants, respectively; and
   the predicted time instant directly precedes a turn-on time instant or a turn-off time instant.

3. The control circuit of claim 1, wherein
   the power transistor is part of a half bridge comprising a second power transistor;
   the control circuit is configured to turn on the power transistor and the second power transistor repeatedly and alternately in a mutually exclusive manner, such that a time instant at which one of the power transistors of the half bridge is turned off and a subsequent time instant at which the other one of the power transistors of the half bridge is turned on are separated by a dead time interval; and
   the predicted time instant falls within a dead time interval.

4. The control circuit of claim 1, wherein
   the power transistor is a low side transistor of a half bridge which also comprises a high side transistor;
   the half bridge is arranged between a supply potential and a reference potential;
   the predicted time instant lies between a time instant at which the high side transistor is turned off and a subsequent time instant at which the power transistor is turned on; or
   the predicted time instant lies between a time instant at which the power transistor is turned off and a subsequent time instant at which the high side transistor is turned on.

5. The control circuit of claim 1, wherein
   the power transistor exhibits a threshold voltage corresponding to a minimum gate-source voltage which is to be applied to the gate of the power transistor for turning on the power transistor; and
   the control circuit is configured to
      set the pre-bias potential at a level which lies below the threshold voltage; and/or
      charge a gate capacitance of the power transistor using the pre-bias current such that the gate exhibits a potential which lies below the threshold voltage.

6. The control circuit of claim 1, wherein the control circuit is configured to set the pre-bias potential and/or charge a gate capacitance of the power transistor using the pre-bias current such that conduction through the body diode is prevented at the predicted time instant.

7. The control circuit of claim 1, wherein the control circuit comprises
   a first control switch configured to couple the gate of the power transistor with a first potential for turning on the power transistor;
   a second control switch configured to couple the gate of the power transistor with a second potential for turning off the power transistor; and
   a third control switch configured to couple the gate of the power transistor with the pre-bias potential; wherein the pre-bias potential is an intermediate potential between the first potential and the second potential.

8. The control circuit of claim 1, wherein
   the control circuit comprises pre-bias circuitry configured to charge a gate capacitor at the gate of the power transistor to the pre-bias potential;
   the pre-bias circuitry comprises an operational amplifier having an output controlling a first transistor and a second transistor;

a source of the first transistor is fed back to an input of the operational amplifier;

another input of the operational amplifier is coupled to a target level of the pre-bias potential; and a source of the second transistor is configured to charge the gate capacitor at the gate of the power transistor to the pre-bias potential.

9. The control circuit of claim 1, wherein the control circuit is configured to determine temperature information regarding a temperature of the power transistor; and adapt a level of the pre-bias potential and/or of the pre-bias current in dependence of the temperature information.

10. The control circuit of claim 9, wherein the control circuit is configured to increase the level of the pre-bias potential and/or of the pre-bias current, if the temperature information indicates that the temperature of the power transistor has dropped; and/or decrease the level of the pre-bias potential and/or of the pre-bias current, if the temperature information indicates that the temperature of the power transistor has increased.

11. The control circuit of claim 1, wherein the control circuit is configured to determine a voltage indication indicating a level of the drain potential at the drain of the power transistor; and adapt a level of the pre-bias potential and/or of the pre-bias current in dependence of the voltage indication.

12. The control circuit of claim 11, wherein the control circuit is configured to increase the level of the pre-bias potential and/or of the pre-bias current, if the voltage indication indicates that the drain potential has dropped further below the source potential; and/or decrease the level of the pre-bias potential and/or of the pre-bias current, if the voltage indication indicates that the drain potential has moved closer to the source potential.

13. The control circuit of claim 1, wherein the control circuit is configured to determine a load indication indicating a level of a drain-source current flowing through the power transistor, when the power transistor is turned on; and adapt a level of the pre-bias potential and/or of the pre-bias current in dependence of the load indication.

14. The control circuit of claim 13, wherein the control circuit is configured to increase the level of the pre-bias potential and/or of the pre-bias current, if the load indication indicates that the level of the drain-source current has increased; and/or decrease the level of the pre-bias potential and/or of the pre-bias current, if the load indication indicates that the level of the drain-source current has decreased.

15. The control circuit of claim 1, wherein the power transistor is operated within a host circuit, notably a power converter; and the control circuit is configured to determine an operational condition of the host circuit; and to adapt a level of the pre-bias potential and/or of the pre-bias current in dependence of the operational condition.

16. The control circuit of claim 1, wherein the control circuit is configured to determine a level of the pre-bias current in dependence of a gate capacitance of the gate of the power transistor and in dependence of a level of the pre-bias potential; and provide the determined level of the pre-bias current to the gate of the power transistor prior to the predicted time instant, such that at the predicted time instant the gate exhibits the pre-bias potential.

17. The control circuit of claim 1, wherein the power transistor is operated within a host circuit, notably a power converter;

the host circuit comprises a plurality of power transistors which are operated in a corresponding plurality of parallel slices; and the control circuit is configured to determine a load indication indicating a level of a drain-source current flowing through the plurality of power transistors, when the plurality of power transistors is turned on; and adapt a number of power transistors from the plurality of power transistors, to which the pre-bias potential is applied and/or to which the pre-bias current is provided in dependence of the load indication.

18. A method for controlling a power transistor; wherein the power transistor exhibits a drain, a gate and a source, and wherein the power transistor exhibits a body diode; wherein the method comprises predicting a time instant or time interval, at which a drain potential at the drain falls below a source potential at the source of the power transistor by more than a diode threshold voltage of the body diode;

applying a pre-bias potential and/or provide a pre-bias current to the gate of the power transistor in dependence of the predicted time instant or time interval, such that a conducting channel between the drain and the source is provided, which at least partially takes over current which would otherwise flow through the body diode.

* * * * *